United States Patent [19]
Yuan et al.

[11] Patent Number: 6,008,610
[45] Date of Patent: Dec. 28, 1999

[54] POSITION CONTROL APPARATUS FOR FINE STAGES CARRIED BY A COARSE STAGE ON A HIGH-PRECISION SCANNING POSITIONING SYSTEM

[75] Inventors: Bausan Yuan, San Jose, Calif.; Kazuaki Saiki, Tokyo, Japan

[73] Assignee: Nikon Corporation, Tokyo, Japan

[21] Appl. No.: 09/045,218

[22] Filed: Mar. 20, 1998

[51] Int. Cl.$^6$ .................................................. G05B 11/18
[52] U.S. Cl. ............................................................ 318/592
[58] Field of Search ................................ 318/592, 594, 318/593, 648, 649

[56] References Cited

U.S. PATENT DOCUMENTS

| | | | |
|---|---|---|---|
| 3,350,612 | 10/1967 | Hansen et al. | 318/143 |
| 3,886,421 | 5/1975 | Hassan et al. | 318/593 |
| 4,016,396 | 4/1977 | Hassan et al. | 219/121 |
| 4,221,995 | 9/1980 | Barkman | 318/616 |
| 4,447,770 | 5/1984 | Shepherd | 318/618 |
| 4,456,860 | 6/1984 | Cann et al. | 318/561 |
| 4,535,277 | 8/1985 | Kurakake | 318/561 |
| 4,577,141 | 3/1986 | Saiki et al. | 318/590 |
| 4,810,941 | 3/1989 | Ohishi et al. | 318/314 |
| 4,810,946 | 3/1989 | Sweeney, Jr. | 318/561 |
| 4,818,885 | 4/1989 | Davis et al. | 250/492.2 |
| 4,952,858 | 8/1990 | Galburt | 318/647 |
| 5,070,287 | 12/1991 | Boehm | 318/569 |
| 5,153,494 | 10/1992 | Hollis, Jr. | 318/640 |
| 5,184,055 | 2/1993 | Ohishi et al. | 318/615 |
| 5,196,745 | 3/1993 | Trumper | 310/12 |
| 5,249,118 | 9/1993 | Smith | 364/167.01 |
| 5,262,707 | 11/1993 | Okazaki et al. | 318/592 |
| 5,478,043 | 12/1995 | Wakui | 248/550 |
| 5,504,407 | 4/1996 | Wakui et al. | 318/568.17 |
| 5,545,962 | 8/1996 | Wakui | 318/677 |
| 5,548,195 | 8/1996 | Doran | 318/568.19 |
| 5,589,748 | 12/1996 | Kazama et al. | 318/560 |

*Primary Examiner*—William M. Shoop, Jr.
*Assistant Examiner*—Rina I. Duda
*Attorney, Agent, or Firm*—Kjerven, Morrill, MacPherson, Franklin and Friel; Michael J. Halbert

[57] ABSTRACT

A position control apparatus for synchronously controlling the movement of fine stages in a high-precision scanning positioning instrument. The position control apparatus uses actuators to adjust the fine stages with six degrees of freedom. By adjusting the fine stages, any synchronous errors between the fine stages during scanning may be dynamically corrected. Further, the fine stages may be adjusted during periods of acceleration and deceleration to reduce the settling time and consequently increasing throughput. Encoders directly attached to the actuators produce signals that are used in a velocity feedback loop. The locations of the fine stages are measured by interferometers. The position control apparatus uses a position control circuit to control the actuators to compensate for synchronous error.

25 Claims, 9 Drawing Sheets

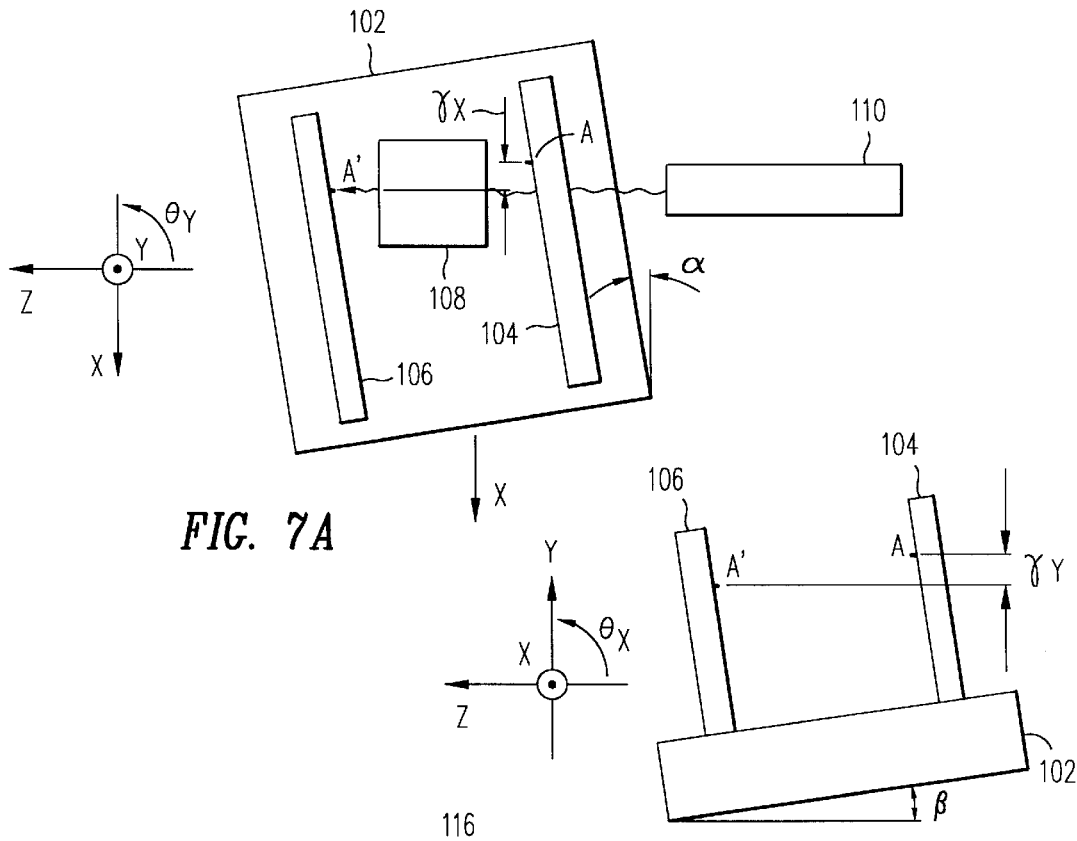
FIG. 7A
FIG. 7B
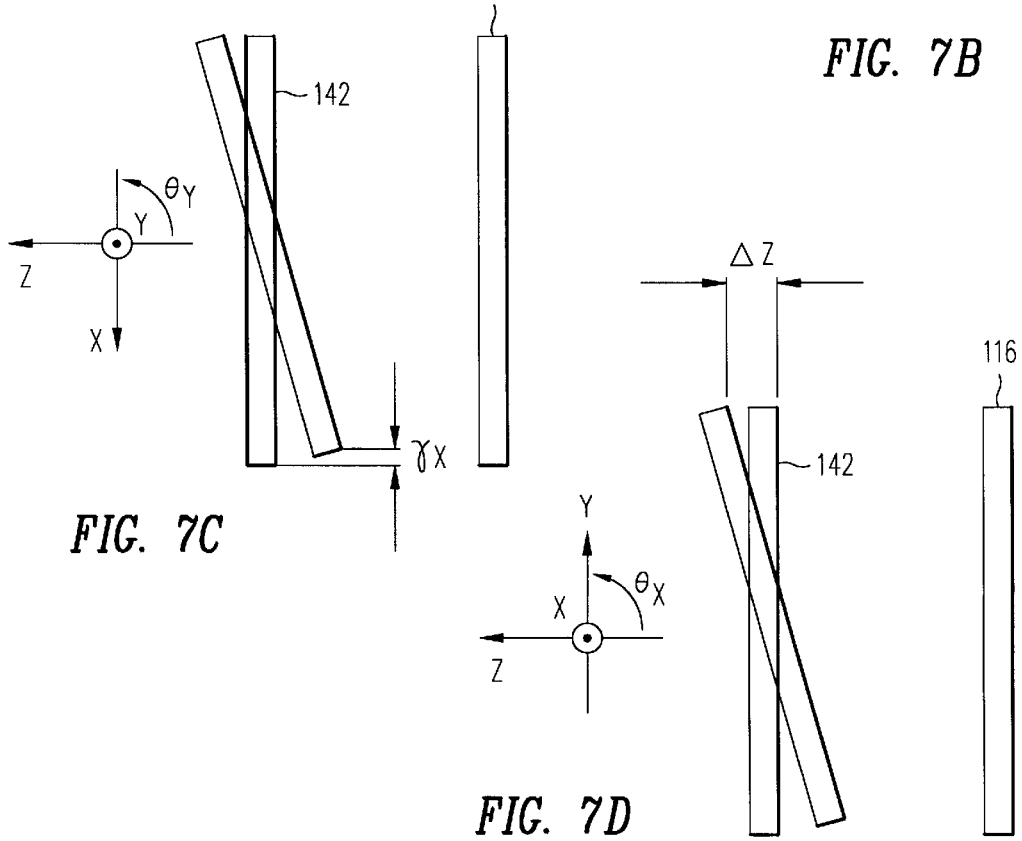
FIG. 7C
FIG. 7D

POSITION CONTROL APPARATUS FOR FINE STAGES CARRIED BY A COARSE STAGE ON A HIGH-PRECISION SCANNING POSITIONING SYSTEM

FIELD OF THE INVENTION

The present invention relates to a position control apparatus and method for sensing and controlling the movement of high-precision positioning instruments. More particularly, the present invention relates to the synchronous positioning control for the fine stages used in a scanning microlithographic system.

BACKGROUND

Position control apparatuses are used to drive systems, such as machining tools and lithography stages, in accordance with a defined path. The path may have one direction, e.g., the X coordinate, or two directions, e.g., the X and Y coordinates. Typically in a lithography apparatus for semiconductor wafer processing, a stage is used to position a mask (reticle) in two dimensions, while a separate stage is used to position the plate (wafer). The stages are moved relative to a base structure which supports the stages and other components such as a source of radiant energy and a projection lens to focus the energy. The stages may be moved in a step-and-repeat pattern or in a scanning pattern, in which the stages maintain a constant velocity during exposure.

A position control apparatus used to drive and position stages are known; see U.S. Pat. Nos. 5,184,055 and 4,952,858. Generally, position control apparatuses are concerned with compensating forces to limit vibration of the stages. This is particularly true with a step-and-repeat system where there are many accelerations (and decelerations) of the stages being driven. To limit vibrations or resonance of the system, the position control apparatuses use acceleration as a feedback control mechanism.

FIG. 1 is a block diagram showing a position control apparatus 10 which limits vibrations in the controlled system 16. Position control apparatus 10 has a control circuit 12 which receives a positioning error signal from node 14. The positioning error signal represents the difference between the desired position of the controlled system and the actual current position. The actual position may be determined by an interferometer or other appropriate measurement device. The control circuit 12 receives the positioning error signal and produces a control signal. The controlled system 16, such as an X-Y stage, receives a signal from node 18, which represents the difference between the control signal from control circuit 12 and an acceleration feedback signal from feedback circuit 20. An acceleration sensor (not shown), which provides an acceleration feedback signal, is mounted on controlled system 16. Feedback circuit adjusts the gain of the acceleration feedback signal and provides the resulting signal to node 18. A position gauge 22, such as a laser interferometer provides a signal representing the current actual position of controlled system 16. The signal from position gauge 22 is then fed back to node 14.

The position control apparatus of FIG. 1 thus moves controlled system 16 to the new desired location. Use of an acceleration feedback loop permits modifying the control signal from control circuit 12 in response to the current acceleration of controlled system 16. Consequently, controlled system 16 is moved such that the resonance of controlled system 16 is reduced.

Where the stages are moved in a scanning pattern, however, the stages are moved at a constant velocity. The stages are subject to acceleration primarily at the beginning and end of the scan. Consequently, in a scanning system, problems created by the resonance of the system are not as prevalent as found in a step-and-repeat system.

However, in a scanning system the stages must be moved in a synchronous fashion. The position control apparatus must drive the stages at a constant velocity while maintaining the alignment of the stages. Where extreme precision is required, such as in a microlithographic system that produces images on the sub-micron scale, any misalignment of the stages will result in defects in the exposed image. Misalignment of the stages is known as synchronous error. Thus, a position control apparatus that drives stages at a constant velocity with a minimum of synchronous error is needed.

Further, because exposure of the plate can only occur while the system is at a constant velocity, the system must wait for the stages to accelerate to the constant velocity at the beginning of the scan before beginning the exposure and must end the exposure prior to decelerating the stages at the end of the scan. The time spent accelerating and decelerating the system is known as the settling time of the system and is a limitation on the throughput of the system. To increase the efficiency of the system, it is desirable to reduce the settling time.

SUMMARY

In accordance with the present invention, a position control apparatus synchronously controls the movement of fine stages in a high precision scanning positioning instrument, such as a microlithographic system. Two fine stages are attached to a coarse stage, which moves at a constant velocity during a scan. In one embodiment, each fine stage includes a frame component which is attached to the coarse stage. The frame component is attached via actuators to a holder component, which holds a mask or plate. During scanning, the position control apparatus uses the actuators to adjust the fine stages in six degrees of freedom relative to each other. By adjusting the fine stages, any synchronous error may be dynamically corrected during the scanning process. Further, the settling time of the system may be minimized by using the actuators to forward feed the fine stages during acceleration and deceleration of the system.

Encoders are coupled to the actuators and output signals that indicate the rate of change in the position (velocity) of the fine stages relative to the coarse stage. The actual positions of the fine stages are measured by interferometers. Using a position feedback loop with signals representing the actual positions of the fine stages, the position control apparatus produces control signals to control the actuators. A velocity feedback loop with signals representing the velocity of the fine stages relative to the coarse stage modifies the control signals to synchronously control the fine stages.

BRIEF DESCRIPTION OF THE DRAWINGS

FIGS. 7A, 7B, 7C, and 7D show possible synchronization errors between the mask fine stage and the plate fine stage, including yaw, roll, foreshortening, and distance error.

DETAILED DESCRIPTION

Figure 1:
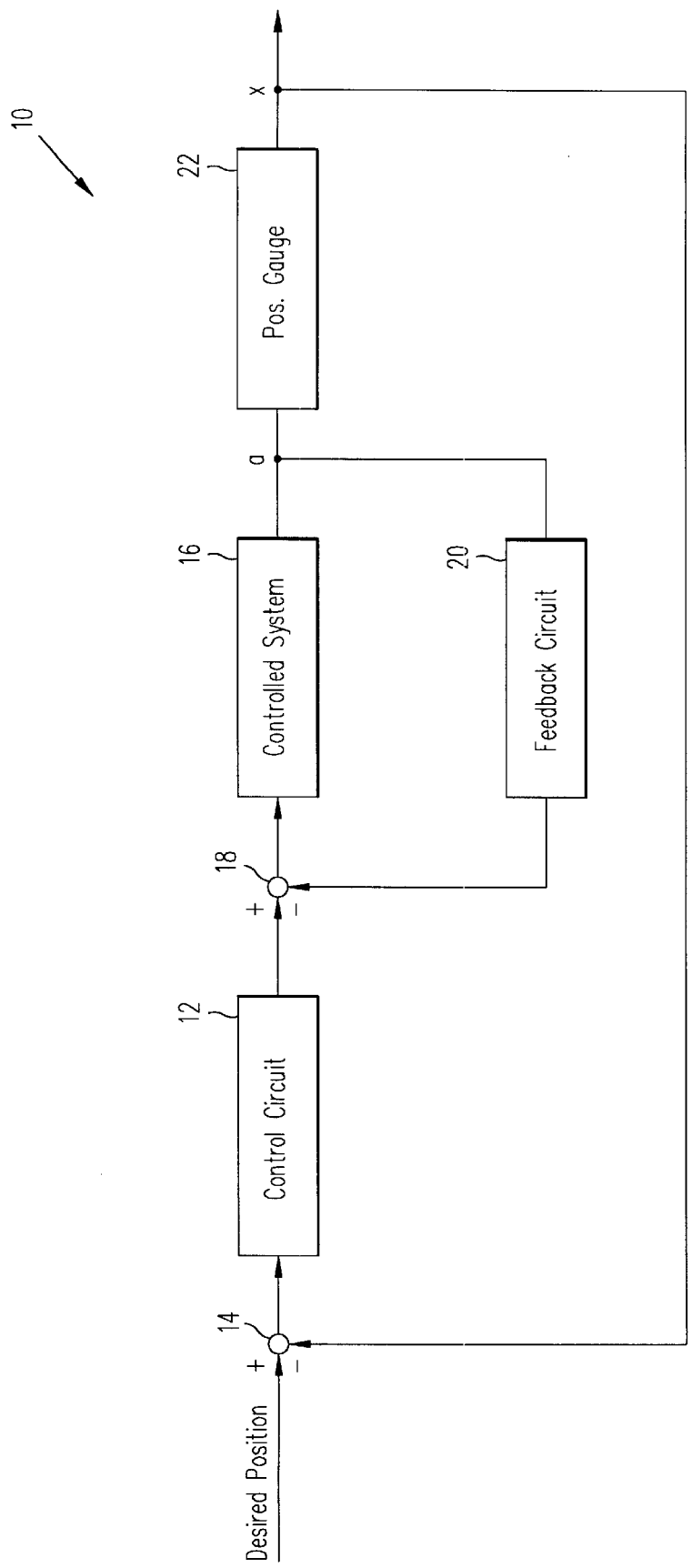
FIG. 1 shows a block diagram of a position control apparatus in accordance with the prior art.
Figure 2:
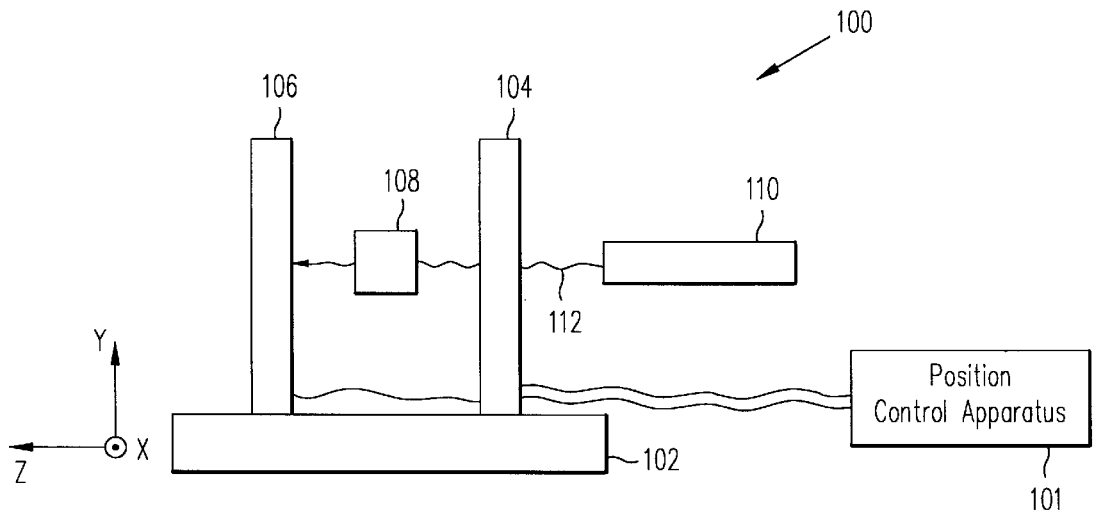
FIG. 2 shows a front view of a simplified microlithographic positioning table mechanism with a coarse stage, a mask fine stage, and a plate fine stage.

FIG. 2 shows a front view of a simplified scanning microlithographic positioning table mechanism 100. Table mechanism 100 includes a coarse stage 102, a mask (reticle) fine stage 104, and a plate (wafer) fine stage 106. Also shown in FIG. 2 are a projection lens 108, an illumination apparatus 110, and a position control apparatus 101, which controls the position 9 of mask fine stage 104 and plate fine stage 106. Coarse stage 102 is supported by an antivibration device (not shown) and is conventionally driven, for instance, by linear servo motors and ball screws or by rotary motors. Coarse stage 102 may be supported by anti-friction bearings, such as air bearings or roller bearings, as is well known in the art. Coarse stage 102 is conventionally scanned in the X coordinate direction at a constant velocity while illumination apparatus 110 and projection lens 108 remain relatively stationary. The scanning of a coarse stage is well known by those skilled in the art and needs no further explanation. Although the present invention is described with reference to a scanning microlithographic system, it is understood that the present invention applies to other high-precision positioning systems as well.

Illumination apparatus 110 is a conventional microlithographic illumination apparatus and produces a beam 112 used to expose the semiconductor wafer. Any suitable illuminating service, including high pressure mercury lamp, ArF laser, KRF laser, ultraviolet, x-ray, ion beam or electron beam, may be used with the present invention. Projection lens 108 may also be a lens system used in a conventional microlithographic apparatus. Both illumination apparatus 110 and projection lens 108 are stationary and are supported by an anti-vibration device (not shown).

Figure 3:
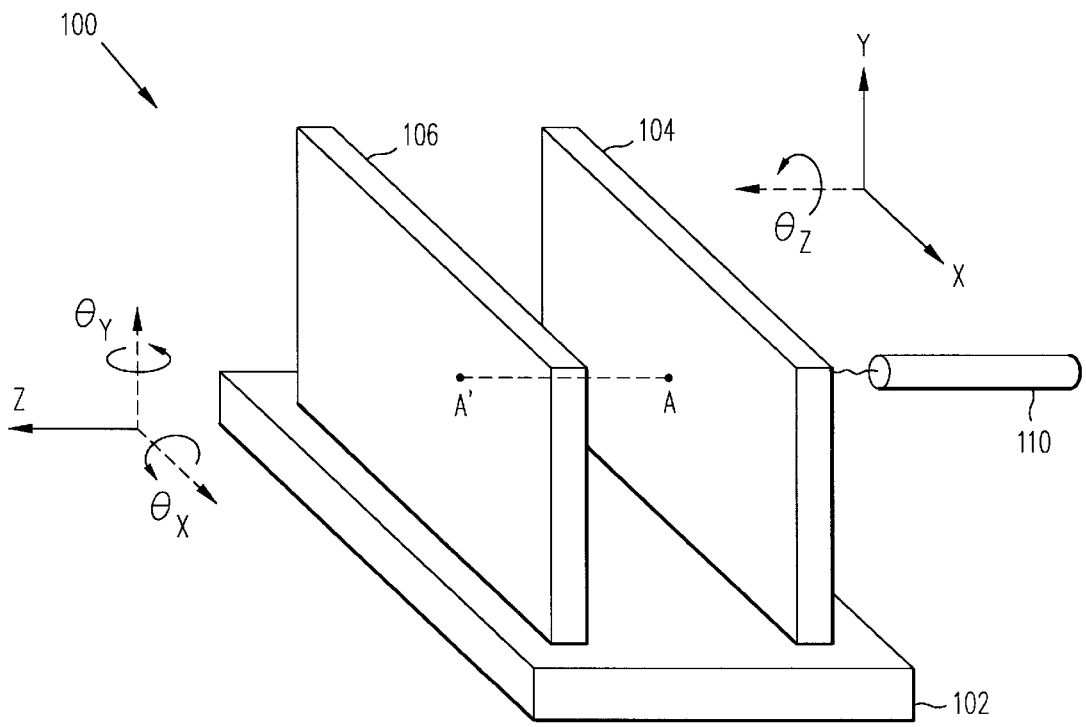
FIG. 3 shows a perspective view of the microlithographic positioning table mechanism of FIG. 2.

FIG. 3 shows a perspective view of microlithographic positioning table mechanism 100. As positioning table mechanism 100 is driven in the X coordinate direction, mask fine stage 104 and plate fine stage 106 are scanned across illumination apparatus 110 and projection lens 108 (not shown in FIG. 3). As shown in FIG. 3, the point on mask fine stage 104 that is being illuminated by illumination apparatus 110, shown as point A, is aligned with the point on plate fine stage 106 that is being exposed, shown as point A'. As coarse stage 102 scans at a constant velocity, point A on mask fine stage 104 and point A' on plate fine stage 106 must remain in alignment. Any misalignment, known as synchronous error, between fine stages 104, 106 will produce inaccuracies in the exposed plate. Synchronous error is particularly important in a microlithographic system where the resolution is on the sub-micron scale.

While coarse stage 102 is moving, mask fine stage 104 and plate fine stage 106 move relative to coarse stage 102 to dynamically correct any synchronous error, thus maintaining point A and point A' in alignment. As shown in FIG. 3, the combined movements of mask fine stage 104 and plate fine stage 106 have six degrees of freedom. For example, mask fine stage 104 may move in the X, Y, and $\theta_Z$ coordinates, while plate fine stage 106 may move in the $\theta_X$, $\theta_Y$, and Z coordinates. It is understood, however, that fine stages 104, 106 may have any combination of movements in accordance with the present invention, including maintaining one fine stage stationary relative to coarse stage 102, while moving the other fine stage with all six degrees of freedom.

Figure 4:
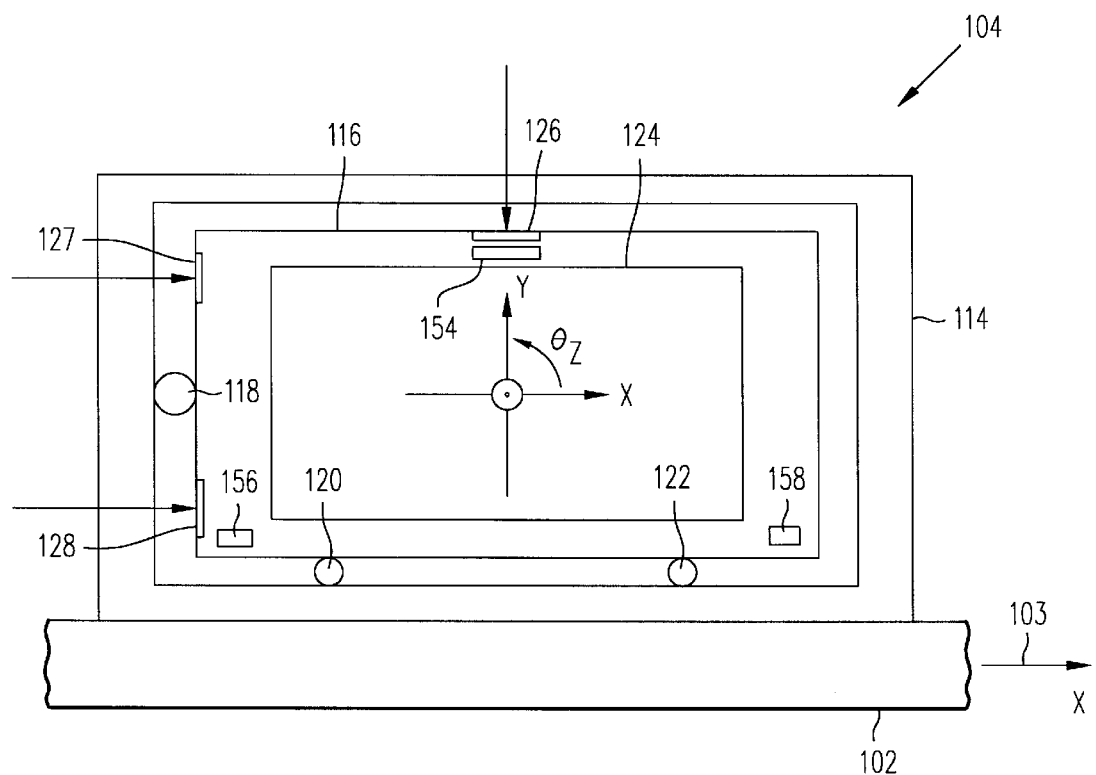
FIG. 4 shows a side view of a mask fine stage, including a mask frame attached to a coarse stage, and a mask holder connected to the mask frame via actuators.

FIG. 4 shows a side view of mask fine stage 104, in accordance with one embodiment of the present invention. Mask fine stage 104 includes a mask frame 114 attached to coarse stage 102. A mask holder 116 is connected to mask frame 114 by way of actuators 118, 120, 122. A mask 124 is held by mask holder 116 in a conventional manner, as is well understood in the art. Actuators 118, 120, 122 are disposed between mask holder 116 and mask frame 114 such that they can move mask holder 116 in the X, Y, or $\theta_Z$ coordinates to correct any synchronous error in those directions while coarse stage 102 moves at a constant velocity in the X coordinate as shown by the arrow 103. It is understood that reference to moving mask fine stage 104 relative to coarse stage 102 includes moving mask holder 116.

Actuator 118 moves mask holder 116 in the X coordinate, while actuators 120 and 122 may move mask holder 116 in the Y coordinate if they are simultaneously moved in the same direction. Actuators 120 and 122 may also move mask holder 116 in the $\theta_Z$ direction if one actuator is moved in one direction more than the other actuator.

To control the accuracy of the system, the actual positions of fine stages 104, 106 are measured relative to each other and relative to a known fixed position. The actual position of mask holder 116 is measured by a position measurement system, such as a laser interferometer. FIG. 4 shows measuring mirrors 126, 127, and 128 on mask holder 116, which are used to measure the position of mask holder 116 in the X, Y, and $\theta_Z$ coordinates. Because interferometers are differential devices, the position of mask holder 116 is measured relative to a stationary component of the table mechanism, such as projection lens 108, shown in FIG. 2, to obtain the actual position of mask holder 116. However, the position of mask holder 116 must also be measured relative to plate stage 106. Thus, plate stage 106 also has measuring mirrors 126, 127, 128 to measure its position in the X, Y, and $\theta_Z$ coordinates. The $\theta_X$, $\theta_Y$, and Z coordinates of mask holder 116 are also measured using measuring mirrors 154, 156, and 158 to compare with the position of plate fine stage 106 in the same coordinates. Measuring the current location of a stage with laser interferometers is well within the skill of those in the art.

Figure 5:
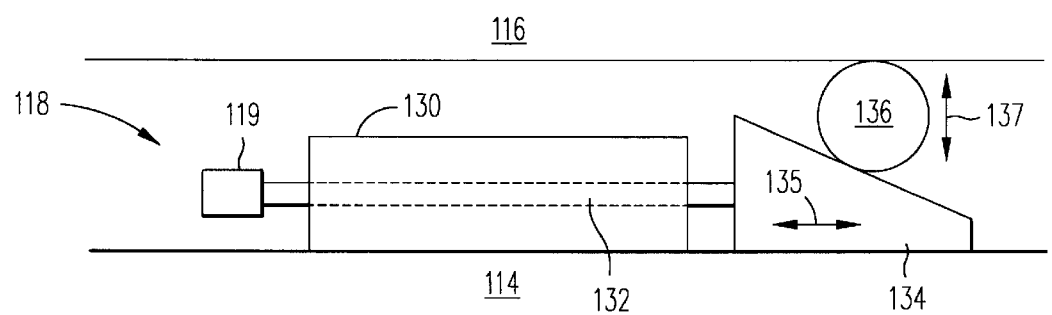
FIG. 5 shows a side view of an actuator disposed between the mask frame and mask holder.

FIG. 5 shows a close up side view of actuator 118, including attached encoder 119. It is understood that actuators 120 and 122 are the same as actuator 118. Actuator 118 which may be a voice-coil actuator which includes a voice coil (linear) motor 130 attached to mask frame 114. Motor 130 moves a shaft 132, which drives a wedge 134 in a direction parallel to mask frame 114, as shown by arrow 135. The movement of wedge 134 is translated to a roller 136, which moves perpendicularly to mask frame 114 due to wedge 134, as shown by arrow 137. Roller 136 is in contact with mask holder 116, and thus the perpendicular motion of roller 136 is thereby translated to mask holder 116. It is understood that actuator 118 is shown by way of example, and other actuators may also be used, including, for example, other types of electro-magnetic actuators or screw type actuators.

A sensor such as an encoder 119 is directly attached to shaft 132 of actuator 118 to determine the amount of drive provided to mask holder 116 through actuator 118. Encoder 119 measures the position of actuator 118. The position control apparatus 101, shown in FIG. 2, uses the position information from encoder 119 to measure the rate of change of position of actuator 118, which is approximately a measure of the velocity of mask holder 116 relative to coarse stage 102 in the X coordinate. Because encoder 119 is directly attached to actuator 118, any flexation or vibration of mask holder 116 will have little affect on the measurement of the velocity of mask holder 116. Additional encoders are likewise directly attached to respective actuators 120 and 122 so position control apparatus 101 can determine the approximate velocity of mask holder 116 relative to coarse stage 102 in the Y and $\theta_Z$ coordinates. The measured velocity of mask holder 116 provided by the encoders is used in a velocity feedback loop in the position control apparatus.

In an alternative embodiment, mask holder 116 is connected to coarse stage 102 via actuators, obviating the need for mask frame 114. In such an embodiment, actuators 120 and 122 may be used to move mask holder 116 in the Y and $\theta_Z$ coordinates, where actuators 120 and 122 are disposed between mask holder 116 and coarse stage 102. Actuator 118 may be attached to coarse stage 102 and used to directly move mask holder 116 in the X coordinate, however, without the need to use wedge 134 and roller 136.

Figure 6A:
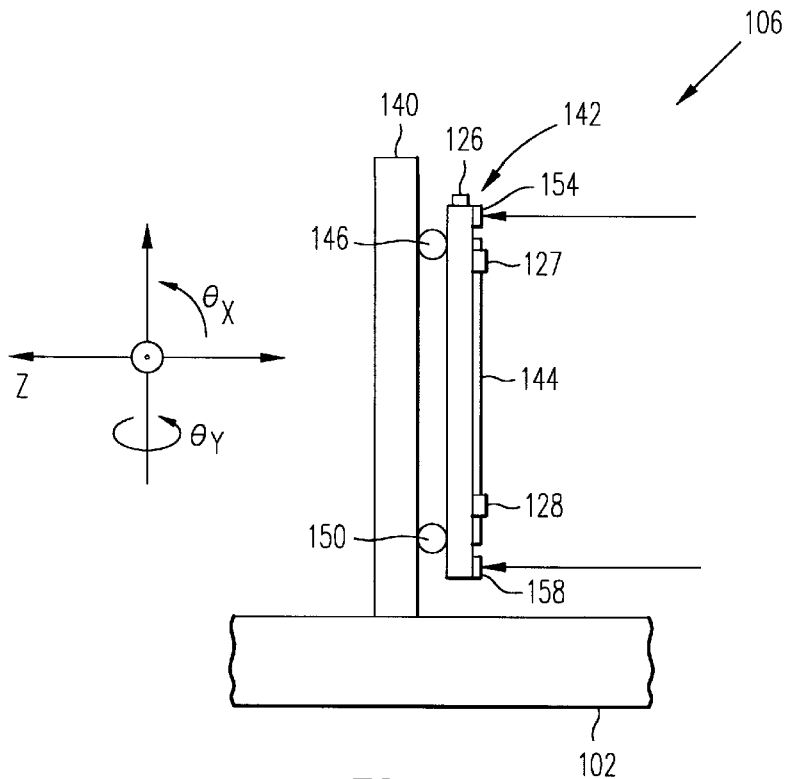
FIGS. 6A and 6B show the front and side views, respectively, of a plate fine stage including a plate frame attached to a coarse stage and a plate holder connected to the plate frame via actuators.
Figure 6B:
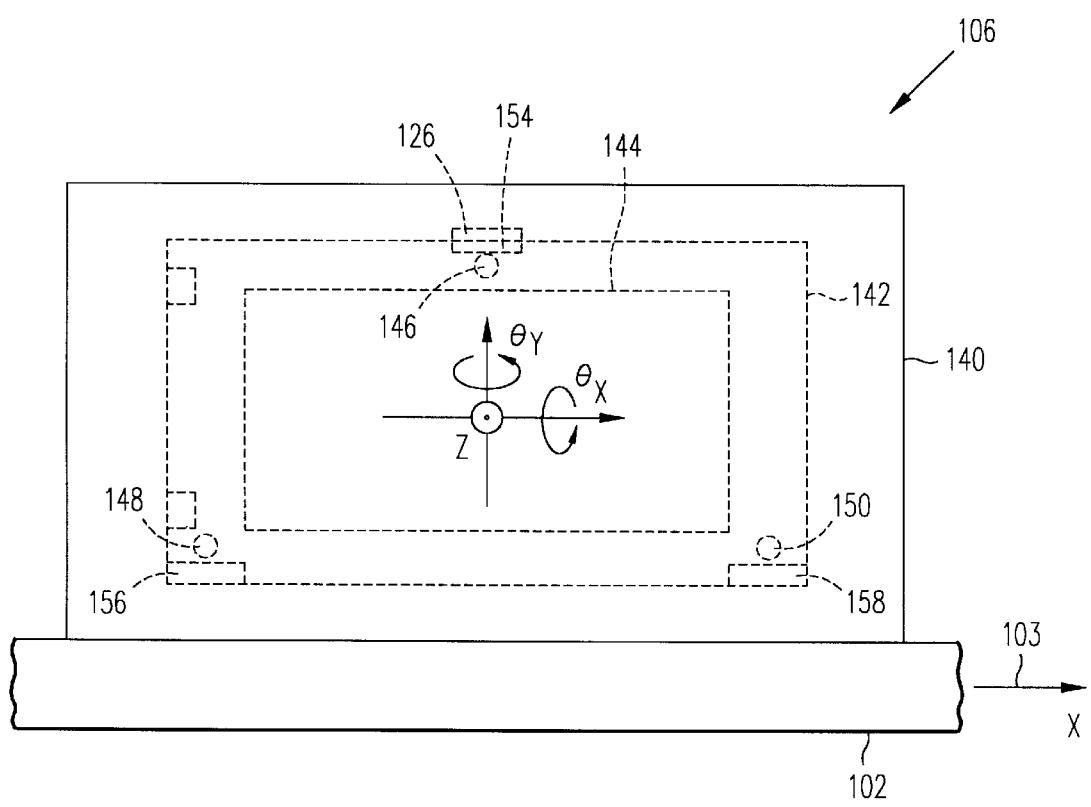

FIGS. 6A and 6B show the respective front and side views of plate fine stage 106, in accordance with one embodiment of the present invention. Plate fine stage 106 includes a plate frame 140 connected to coarse stage 102 and a plate holder 142 conventionally holding a plate 144. Actuators 146, 148, and 150 are positioned between plate frame 140 and plate holder 142, such that plate holder 142 may be moved in the $\theta_X$, $\theta_Y$ and Z coordinates, as shown in FIGS. 6A and 6B. Coarse stage 102 is moved in the X direction at a constant velocity, as shown by arrow 103 in FIG. 6B, while plate holder 142 is moved by actuators 146, 148, and 150 to compensate for any synchronous error in the $\theta_X$, $\theta_Y$, and Z coordinates. Actuators 146, 148, and 150 are similar to actuator 118 as shown in FIG. 5. It is understood, however, that the present invention may be practiced using a different number of actuators and/or actuators positioned in alternative positions. Further, it is understood that the six degrees of freedom between mask stage 104 and plate stage 106 may be interchanged without deviating from the present invention.

The current position of plate holder 142 in the $\theta_X$ $\theta_Y$, and Z coordinates relative to projection lens 108 and mask holder 116 is measured by position sensors 154, 156, and 158 located on plate holder 142, as shown in FIGS. 6A and 6B. As discussed above, plate holder 142 also has associated measuring mirrors 126, 127, and 128 to measure the X, Y, and $\theta_Z$ position of plate holder 142. As with actuator 118 in FIG. 5, encoders are coupled to actuators 146, 148, and 150 to detect the amount of motion provided to plate holder 142. Direct attachment of the encoders to the actuators permits accurate detection of the motion of plate holder 142 without being affected by factors such as flexation and vibration of plate holder 142.

During scanning, coarse stage 102 carries mask fine stage 104 and plate fine stage 106 at a constant velocity. However, slight deviations in the motion of coarse stage 102 or synchronous error between fine stages 104 and 106 during the scanning process will result in imperfections in the exposure of plate 144.

FIG. 7A shows one example of synchronous error where coarse stage 102 has yaw of α degrees, which is greatly exaggerated in FIG. 7A for purposes of illustration. Projection lens 108 and illumination apparatus 110 are stationary. As shown in FIG. 7A points A and A' on respective fine stages 104 and 106 are no longer aligned because of the yaw of coarse stage 102. To compensate for the synchronous error, mask fine stage 104 may move in the X direction by a distance δX and/or plate fine stage 106 may move plate holder 142 in the negative θYdirection by a degrees.

FIG. 7B shows another example of synchronous error where coarse stage 102 has a roll of β degrees, which is greatly exaggerated in FIG. 7B for purposes of illustration. The roll of coarse stage 102 creates a misalignment between points A and A' on respective fine stages 104, 106. To compensate for this synchronous error, mask fine stage 104 may move in the negative Y direction by a distance δY, and/or plate fine stage 106 may move in the negative $\theta_X$ direction by β degrees.

Another source of synchronous error is shown in FIG. 7C. FIG. 7C shows plate holder 142 and mask holder 116 without plate frame 140 and mask frame 114 for the sake of clarity. If plate holder 142 is rotated in the $\theta_Y$ direction as shown, such that plate holder 142 is not level with mask holder 114, a foreshortening effect occurs. The position of the front of plate holder 142 in the X-Y plane is decreased by an amount γX. To compensate for this synchronous error, mask holder 116 must be moved in the negative X direction by γX. The same type of synchronous error may also occur in the Y direction if plate holder 142 rotates in the $\theta_X$ direction. Mask holder 116 may compensate for this synchronous error as well by moving in the Y direction by the appropriate amount.

FIG. 7D shows another source of synchronous error in the form of error in the distance between plate holder 142 and mask holder 116. FIG. 7D shows the front view of plate holder 142 and mask holder 116 again without plate frame 140 and mask frame 114 for the sake of clarity. If plate holder 142 is rotated in the $\theta_X$ direction as shown, the top and bottom portions of plate holder 142 will be in error in the Z direction by an amount ΔZ. To compensate for this synchronous error, plate holder 116 must be moved in the negative Z direction by ΔZ.

Exposure of plate 144 occurs while coarse stage 102 is moving in the X direction at a constant velocity. However, coarse stage 102 must be accelerated to the constant velocity prior to the exposure of plate 144 and then the exposure must end prior to decelerating coarse stage 102. The time it takes to accelerate or decelerate is known as the settling time. Settling time limits the throughput and therefore affects the efficiency of the system.

Figure 8A:
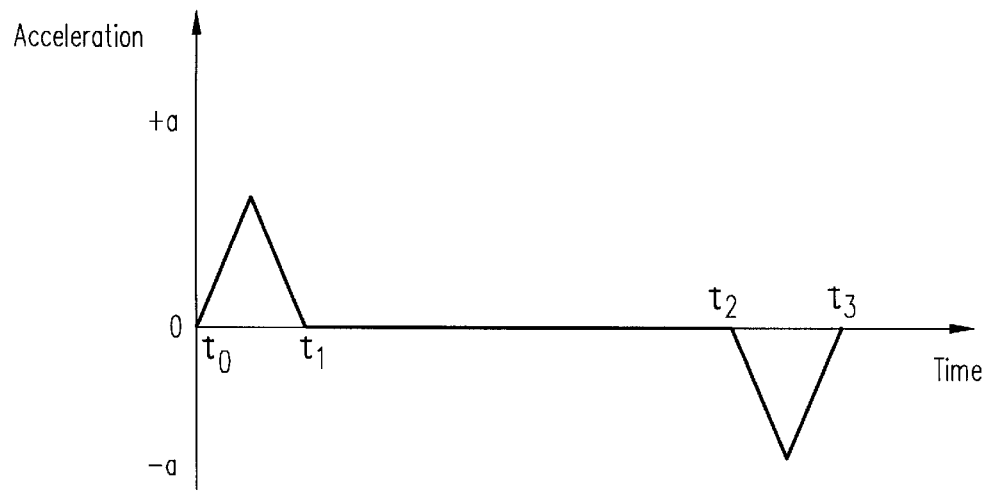
FIGS. 8A, 8B, 8C, 8D, 8E show graphic representations of acceleration, velocity, position, following error, and following error with feed forward, respectively, in the X coordinate in relation to time.
Figure 8B:
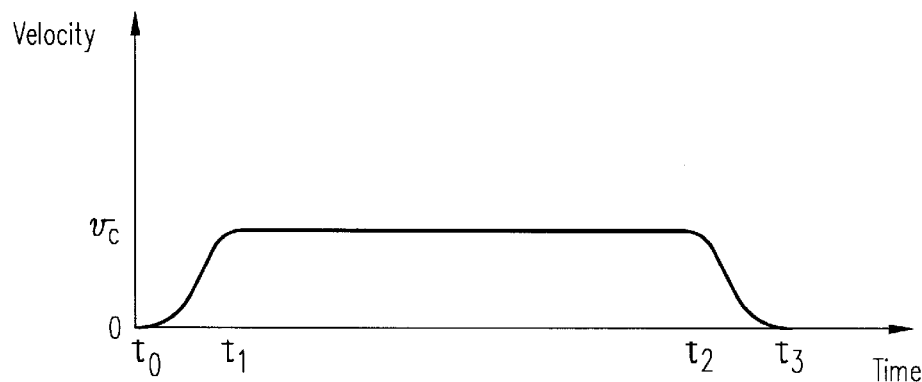
Figure 8C:
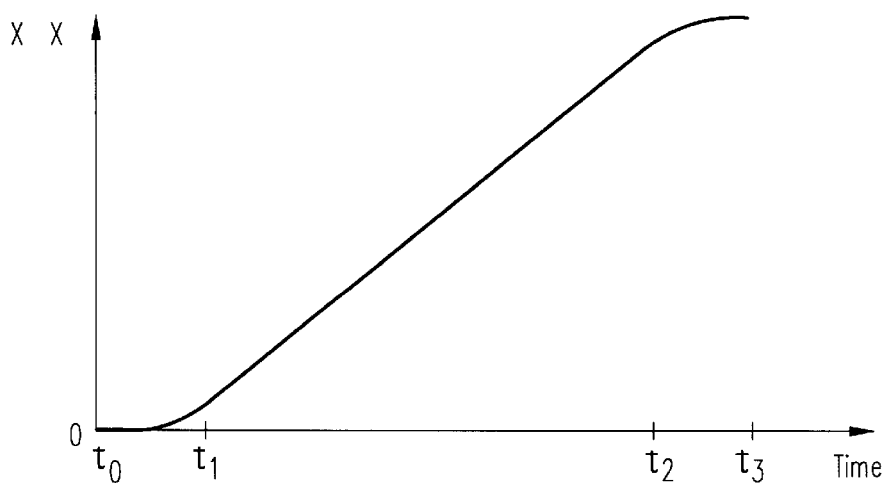

FIGS. 8A, 8B, and 8C are graphic representations of the respective acceleration, velocity and position in the X coordinate of coarse stage 102 in relation to time. FIG. 8A graphically illustrates the acceleration of coarse stage 102 from time t0 to t1 and the deceleration of stage 102 from times t2 to t3. Between time t1 and t2 coarse stage is at a constant velocity $v_c$, during which exposure of plate 144 occurs. FIG. 8B graphically illustrates the velocity of coarse stage 102, which increases between times t0 and t1 and decreases between times t2 and t3. Coarse stage 102 is at a constant velocity $V_c$ between times t2 and t3. Thus, as shown in FIG. 8C, the position of coarse stage 102 has a linear relation to time between times t1 and t3.

Figure 8D:
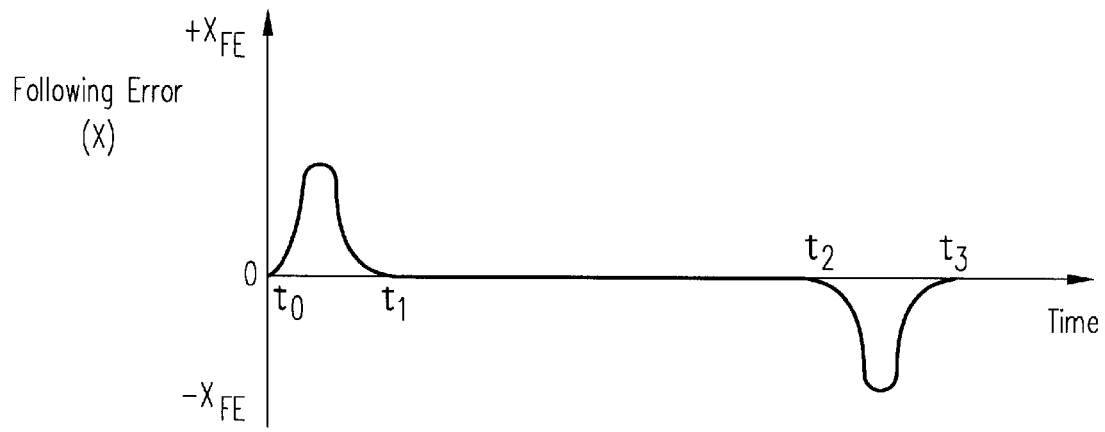

Exposure of plate 144 can occur only when coarse stage 102 is at a constant velocity, because during acceleration and deceleration a following error develops. The following error is the difference between the actual position of coarse stage 102 and the desired stage position. FIG. 8D is a graphic representation of the following error of coarse stage 102 in the X coordinate relative to time. From time t0 to t1, coarse stage 102 suffers from a following error of $X_{FE}$ and from time t2 to t3 there is a following error of $-X_{FE}$.

Figure 8E:
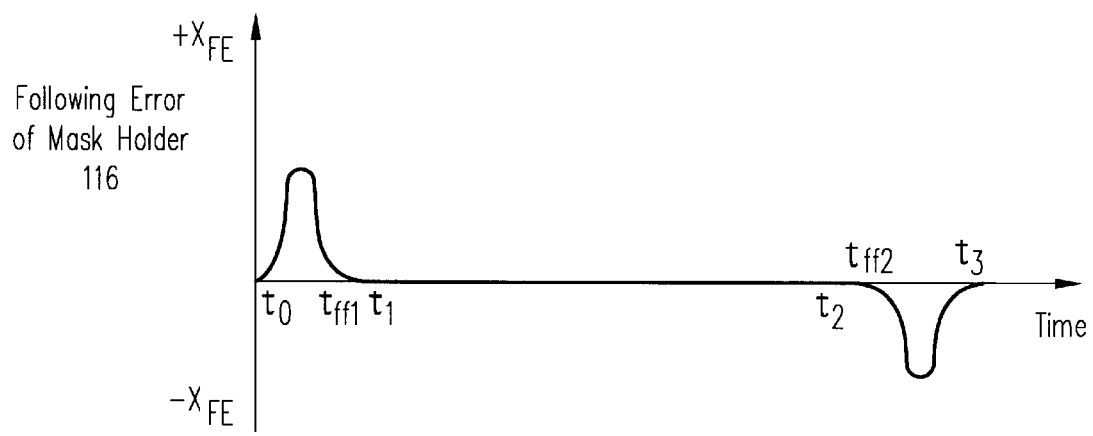

Mask stage 104 may compensate for the following error through the use of actuator 118, which moves mask holder 116 in the X coordinate. As coarse stage 102 accelerates to constant velocity Vc in the X coordinate, position control apparatus 101 feeds mask holder 116 forward using actuator 118. Thus, mask holder 116 reaches the desired constant velocity faster than coarse stage 102 thereby reducing the following error. In addition, when coarse stage 102 is decelerating from the constant velocity Vc, position control apparatus 101 feed forwards mask holder 116 maintaining mask holder 116 at constant velocity Vc for a lengthened period. Thus, as shown in FIG. 8E, mask holder 116 is at constant velocity Vc from time $t_{FF1}$ to time $t_{FF2}$, thereby shortening the settling time and increasing the throughput.

Figure 9:
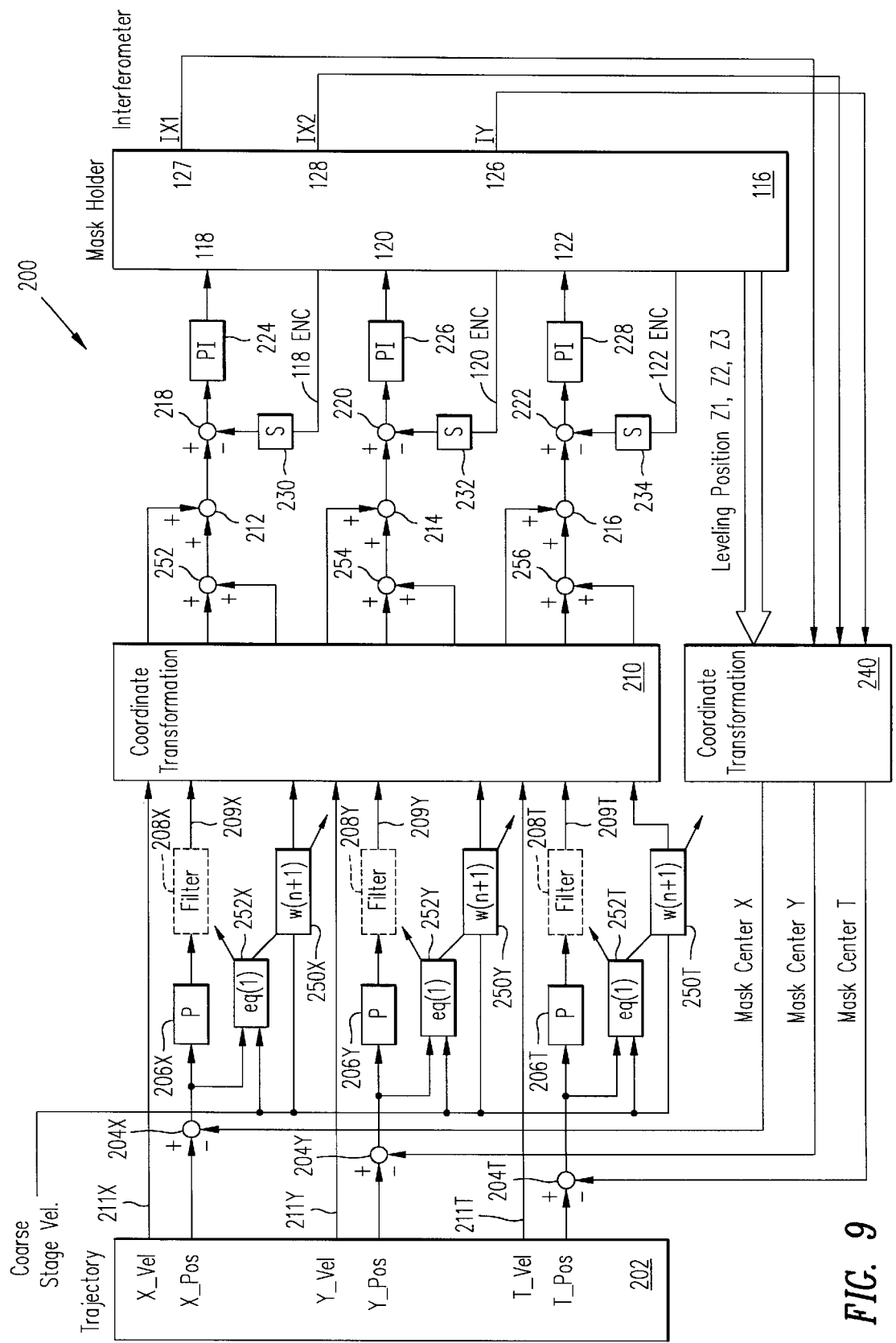
FIG. 9 shows a schematic diagram of a positioning control circuit for controlling the mask fine stage in accordance with the present invention.

FIG. 9 is a schematic view of a positioning control circuit 200 used in position control apparatus 101 to control mask fine stage 104 in accordance with the present invention.

A trajectory command computer 202, such as a digital signal processor or micro-processor, generates command signals for the desired positions and velocities in the X, Y and $\theta_Z$ coordinates for mask fine stage 104. The position command signals generated by command computer 202 are compared at nodes 204X, 204Y, 204T to signals representing the actual X, Y, and $\theta_Z$ positions for the center of gravity of mask holder 116. The actual position for mask holder 116 is determined by interferometers using measuring mirrors 126, 127, and 128, as shown in FIG. 4. Of course, other methods of measuring the actual position may also be used.

The difference between the actual position of the center of gravity of the mask holder 114 as measured by interferometers and the desired position supplied by trajectory command computer 202 is known as the positional error. A positional error signal is generated at nodes 204X, 204Y, and 204T. The positional error signal for each coordinate is amplified at filters 206X, 206Y, and 206T, which may be simple proportional gains. The amplified positional error signal for each coordinate is then filtered by conventional second order notch filters 208X, 208Y, and 208T. Notch filters 208X, 208Y, and 208T are shown with broken lines in FIG. 8 because they may be removed in alternative embodiments.

The positional error signals for each coordinate are fed to a coordinate transformation center 210 via lines 209X, 209Y, and 209T. Coordinate transformation center 210 is a computer that uses software to generate the control signals necessary to control actuators 118, 120, and 122.

Trajectory command center 202 also generates velocity control signals for the desired velocity used to compensate for the following error. Coordinate transformation center 210 receives the velocity command signals for the X, Y, and $\theta_Z$ coordinates via lines 211X, 211Y, and 211T from trajectory command computer 202 and based on these velocity command signals coordinate transformation center 210 produces feed forward commands. The control signals and the feed forward commands are combined at nodes 212, 214, and 216. The resulting control signals are combined with actuator velocity signals from velocity feedback loops at nodes 218, 220, and 222. The resulting signals are then fed into PI filters 224, 226, and 228, respectively.

Each PI filter 224, 226, and 228 executes proportioning and integration of the respective control signals received and generates signals to drive respective actuators 118, 120, and 122 attached to mask holder 116. Velocity feedback loops are provided for the encoders that are directly attached to actuators 118, 120, and 122. Each encoder generates an actuator position signal representing the position of the attached actuator. The actuator position signals are transmitted via lines 118Enc, 120Enc, and 122Enc and are fed into differential circuits 230, 232, and 234, respectively. The differential circuits 230, 232, and 234 take the first derivative of the actuator position signals, producing actuator velocity signals. The actuator velocity signals represent the rate of change of position or velocity of the actuators 118, 120, 122. The velocity of actuators 118, 120, and 122 are subtracted from the control signals at nodes 218, 220, and 222 to maintain system stability.

A position feedback loop is provided by interferometers measuring the actual positions of measuring mirrors 126, 127, and 128 on mask holder 116 relative to another element, such as projection lens 108, as well as the position relative to plate holder 140. The position signals generated by the interferometers representing the actual position of measuring mirrors 126, 127, and 128 are fed via lines IX1, IX2, and IY to a second coordinate transformation center 240. Coordinate transformation center 240 transforms the interferometer measurement of the position of measuring mirrors 126, 127, and 128 into X, Y, and $\theta_Z$ coordinates for the center of gravity of mask holder 116. In addition, the Z coordinate position of mask holder 116 is compared to the Z coordinate position of plate holder 142. This information is also provided to coordinate transformation center 240 so that any leveling error between mask holder 116 and plate holder 142, such as the foreshortening error shown in FIG. 7C, may be corrected. The coordinate signals representing the center of gravity of mask holder 116 are then subtracted from the position command signals at nodes 204X, 204Y, and 204T.

FIG. 9 also includes adaptive filters 250X, 250Y, and 250T, which receive the velocity of coarse stage 102 as well as the positional error signals from respective nodes 204X, 204Y, and 204T via blocks 252X, 252Y, and 252T. Using the velocity of coarse stage 102 and the positional error signals, blocks 252X, 252Y, and 252T generate a weight signal W(n+1) to update the position of mask holder 116. The weight represented by the weight signal is generated in accordance with a least mean square adaptation algorithm:

$$W(n+1)=W(n)+2u(en)*V(c); \qquad \text{equ. 1}$$

where W(n+1) represents the updated weight, W(n) represents the previous weight, 2u represents a coefficient, en represents the deviation of the current position of mask holder 116 from its desired position, and V(c) represents the velocity of coarse stage 102. The coefficient 2u influences how quickly the previous weight converges on the updated weight. If a large coefficient is used the weights converge quickly; however, the system may become unstable, possibly causing vibrations or oscillations in the system. On the other hand, if a small coefficient is used, the system is stable, but the convergence time is longer. In one embodiment the 2u coefficient is chosen such that the weight is updated once per ten cycles, or approximately every five seconds.

Blocks 252X, 252Y, and 252T may be digital signal processors or micro-processors conventionally programmed to update the weight according to equ. 1. The output signals of blocks 252X, 252Y, and 252T are received by respective adaptive filters 250X, 250Y, and 250T, which combine the weights with the velocity of coarse stage 102.

Coordinate transformation center 210 receives the weight signals from adaptive filters 250X, 250Y, and 250T. Coordinate transformation center 210 transforms the weight signals. The transformed weighted signals are then combined with the control signals at nodes 252, 254, and 256.

Thus, with the use of adaptive filters 250X, 250Y, and 250T, the positioning of mask holder 116 is based on the positional error signals as well as the velocity of coarse stage 102. Because the velocity of coarse stage 102 and the deviation from the desired position of mask holder 116 are proportional to each other, considering the velocity of coarse stage 102 while driving mask holder 116 to its desired position improves control stability. Further, different velocities of coarse stage 102 may be used to best accommodate exposure conditions, such as resist sensitivity and exposure intensity, the weight signal produced by adaptive filters 250X, 250Y, and 250T should be set in proportion to the particular velocity of coarse stage 102 that is used.

Figure 10:
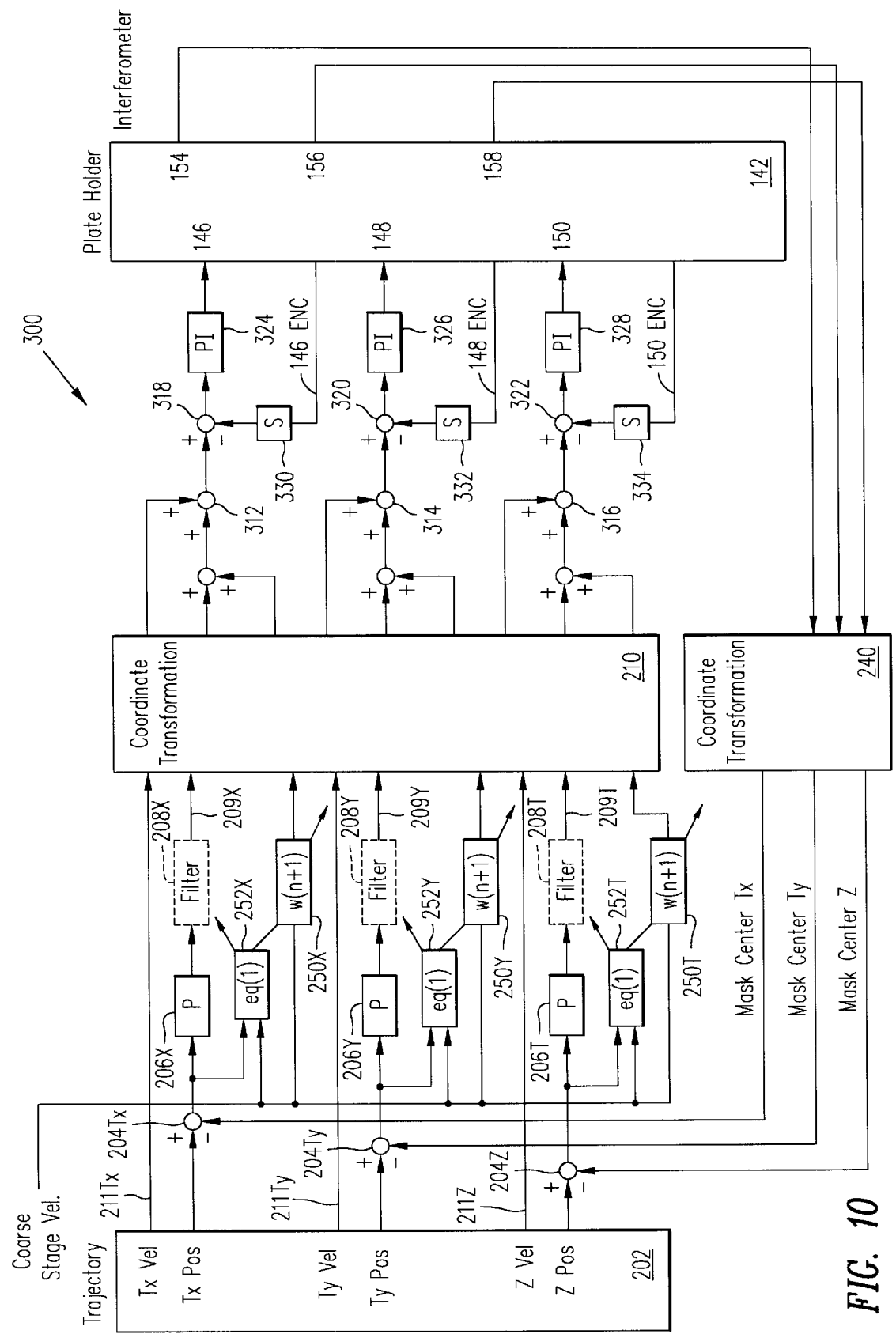
FIG. 10 shows a schematic diagram of a positioning control circuit for controlling the plate fine stage in accordance with the present invention.

FIG. 10 is a block diagram of a position control circuit 300 for controlling plate fine stage 106. Position control circuit 300 is similar to circuit 200, like-designated elements being the same. However, position control circuit 300 controls the $\theta_X$, $\theta_Y$, and Z coordinates of plate holder 142, which the designation of the elements reflects. It is understood that both control circuit 200 and control circuit 300 may be within position control apparatus 101.

While the present invention has been described in connection with specific embodiments, variations of these embodiments will be obvious to those of ordinary skill in the art. For example, fine stages 104, 106 can be modified in accordance with the present invention so that one fine stage is moved with six degrees of freedom while the other fine stage is stationary relative to coarse stage 102. Further, fine stages 104, 106 may be connected directly to coarse stage 102, thus obviating the need for frames 114 and 140. Therefore, the spirit and scope of the appended claims should not be limited to the foregoing description.

What is claimed is:

1. A stage assembly, comprising:
    a coarse stage movable in a first direction;
    a first fine stage movably coupled to said coarse stage;
    a first actuator for moving said first fine stage relative to said coarse stage;
    a first sensor coupled to said first actuator, said first sensor providing a velocity signal corresponding to the velocity of said first fine stage relative to said coarse stage while said coarse stage moves in said first direction;
    a position measurement system, said position measurement system providing a position signal corresponding to the position of said first fine stage;
    a positioning control circuit controlling said first actuator, said positioning control circuit comprising:
        a position feedback circuit, said position feedback circuit responding to said position signal corresponding to the position of said first fine stage; and
        a velocity feedback circuit, said velocity feedback circuit responding to said velocity signal corresponding to the velocity of said first fine stage relative to said coarse stage.

2. The stage assembly of claim 1, wherein said first fine stage is comprised of a fine stage frame fixedly attached to said coarse stage, a holder coupled to said fine stage frame, wherein said first actuator is disposed between said fine stage frame and said holder such that said first actuator moves said holder relative to said fine stage frame.

3. The stage assembly of claim 2, wherein said holder is adapted to hold a mask.

4. The stage assembly of claim 2, further comprising a second actuator and a third actuator disposed between said fine stage frame and said holder, wherein said first actuator, second actuator and third actuator move said holder in at least three degrees of freedom relative to said fine stage frame.

5. The stage assembly of claim 1, further comprising:
    a second fine stage movably coupled to said coarse stage;
    a fourth actuator;
    a second sensor coupled to said fourth actuator for moving said second fine stage relative to said coarse stage, said second sensor providing a second velocity signal corresponding to the velocity of said second fine stage relative to said coarse stage;
    wherein said position measurement system provides a second position signal corresponding to the position of said second fine stage;
    said position control circuit controls said fourth actuator for moving said second fine stage relative to said coarse stage, said position control circuit further comprising;
    a second position feedback circuit, said second position feedback circuit responding to said second position signal corresponding to the position of said second fine stage; and
    a second velocity feedback circuit, said velocity feedback circuit responding to said second velocity signal corresponding to the velocity of said second fine stage relative to said coarse stage.

6. The stage assembly of claim 5, wherein the first fine stage and second fine stage are synchronously driven.

7. The stage assembly of claim 6, wherein said position measurement system measures the position of said first fine stage and said second fine stage relative to each other.

8. The stage assembly of claim 7, wherein said position measurement system is an interferometer.

9. A method for controlling the motion of a first fine stage coupled to a coarse stage, said method comprising the steps of:
    providing command signals for a desired location of said first fine stage;
    providing position signals representing the location of said first fine stage;
    comparing said command signals and said position signals to generate position error signals;
    generating control signals based on said position error signals for controlling the movement of said first fine stage;
    providing velocity signals representing the velocity of said first fine stage relative to said coarse stage;
    comparing said control signals with said velocity signals to generate a movement signal; and
    moving said first fine stage relative to said coarse stage in response to said movement signals.

10. The method of claim 9, further comprising:
    providing a second command signal for the desired location of a second fine stage coupled to said coarse stage;
    providing a second position signal representing the location of said second fine stage;

comparing said second command signal and said second position signal to generate a second position error signal;

generating a second control signal based on said second position error signal for controlling the movement of said second fine stage;

providing a second velocity signal representing the velocity of said second fine stage relative to said coarse stage;

comparing said second control signal with said second velocity signal to generate a second movement signal; and moving said second fine stage relative to said coarse stage in response to said second movement signal.

11. The method of claim 10, wherein said first fine stage and said second fine stage are synchronously controlled.

12. The method of claim 9 further comprising the steps of:

providing a command signal for the desired velocity of said fine stage;

generating a feed forward signal based on said command signal for the desired velocity of said fine stage; and moving said fine stage relative to said coarse stage in response to said feed forward command signal.

13. The method of claim 9 further comprising the steps of:

providing a third velocity signal representing the velocity of said coarse stage;

generating weight signals based on said third velocity signal and said position error signals; and combining said weight signals with said control signals.

14. The method of claim 13 wherein said generating said weight signals uses a least mean square adaptation.

15. An apparatus comprising:

a coarse stage movable in a first direction;

a first fine stage movably coupled to said coarse stage, wherein said first fine stage is movable relative to said coarse stage;

means for moving said first fine stage relative to said coarse stage;

means for generating a first position signal representing the position of said first fine stage;

means for generating a first velocity signal representing the velocity of said first fine stage relative to said stare while said coarse stare moves in said first direction; and a position control circuit controlling said means for moving said first fine stage, said position control circuit comprising:

a position feedback circuit for said first position signal, wherein said position feedback loop controls the position of said first fine stage in response to said first position signal; and a velocity feedback circuit for said first velocity signal, wherein said velocity feedback circuit controls the motion of said first fine stage in response to said first velocity signal.

16. The apparatus of claim 15, further comprising:

a second fine stage coupled to said coarse stage, wherein said second fine stage is movable relative to said coarse stage;

means for moving said second fine stage relative to said coarse stage;

means for generating a second position signal representing the position of said second fine stage;

means for generating a second velocity signal representing the velocity of said second fine stage;

a position feedback circuit for said second position signal, wherein said position feedback circuit controls the position of said second fine stage in response to said second position signal; and a velocity feedback circuit for said second velocity signal, wherein said velocity feedback circuit controls the motion of said second fine stage in response to said second velocity signal.

17. The apparatus of claim 15, wherein said first fine stage comprises a first fine stage frame fixedly attached to said coarse stage and first fine stage holder movably coupled to said first fine stage frame, and wherein said means for moving said first fine stage relative to said coarse stage comprises a first actuator disposed between said first fine stage frame and said first fine stage holder, wherein said first actuator moves said first fine stage holder relative to said first fine stage frame.

18. The apparatus of claim 16, wherein said second fine stage comprises a second fine stage frame fixedly attached to said coarse stage and second fine stage holder movably coupled to said second fine stage frame, and wherein said means for moving said second fine stage relative to said coarse stage comprises a second actuator disposed between said second fine stage frame and said second fine stage holder, wherein said second actuator moves said second fine stage holder relative to said second fine stage frame.

19. The apparatus of claim 16, wherein said means for generating a first position signal and said means for generating a second position signal are interferometers.

20. The apparatus of claim 16, wherein said means for generating a first velocity signal and said means for generating a second velocity signal comprise a first encoder and a second encoder respectively coupled to said first and second actuators.

21. An exposure apparatus that provides synchronized movement of a mask having a pattern with a substrate to expose said pattern on said mask onto said substrate, said apparatus comprising:

a coarse stage moving in a first direction;

a fine stage movably coupled to said course stage, said fine stage holding said mask;

a drive device driving said fine stage; and a controller coupled to said drive device to control said fine stage, said controller comprising a weighting circuit to generate a weight signal in accordance with the velocity of said coarse stage to control the position of said fine stage.

22. The exposure apparatus of claim 21, wherein said weighting circuit comprises an adaptive filter.

23. The exposure apparatus of claim 21, further comprising a projection system located between said mask and said substrate, said projection system projecting said pattern onto said substrate.

24. The exposure apparatus of claim 21, wherein said coarse stage integrally holds said mask and said substrate.

25. The exposure apparatus of claim 21, further comprising a position detection device detecting a position of said fine stage.

* * * * *

UNITED STATES PATENT AND TRADEMARK OFFICE
CERTIFICATE OF CORRECTION

PATENT NO.   : 6,008,610
DATED        : December 28, 1999
INVENTOR(S)  : Bausan Yuan et al.

It is certified that error appears in the above-identified patent and that said Letters Patent is hereby corrected as shown below:

Column 11,
Line 45, please delete "stare" and insert -- stage --.

Signed and Sealed this

Twenty-third Day of July, 2002

Attest:

Attesting Officer

JAMES E. ROGAN
*Director of the United States Patent and Trademark Office*